(12) United States Patent
Steigerwald et al.

(10) Patent No.: US 7,071,494 B2
(45) Date of Patent: Jul. 4, 2006

(54) LIGHT EMITTING DEVICE WITH ENHANCED OPTICAL SCATTERING

(75) Inventors: Daniel A. Steigerwald, Cupertino, CA (US); Jerome C. Bhat, San Francisco, CA (US)

(73) Assignee: Lumileds Lighting U.S. LLC, San Jose, CA (US)

( * ) Notice: Subject to any disclaimer, the term of this patent is extended or adjusted under 35 U.S.C. 154(b) by 0 days.

(21) Appl. No.: 10/317,956

(22) Filed: Dec. 11, 2002

(65) Prior Publication Data

US 2004/0113163 A1 Jun. 17, 2004

(51) Int. Cl.
*H01L 29/22* (2006.01)
(52) U.S. Cl. .................. 257/98; 257/94; 257/103
(58) Field of Classification Search .............. 257/98, 257/103, 94
See application file for complete search history.

(56) References Cited

U.S. PATENT DOCUMENTS

| | | | | |
|---|---|---|---|---|
| 4,971,928 A | 11/1990 | Fuller | .......... | 437/148 |
| 5,032,893 A | 7/1991 | Fitzgerald, Jr. et al. | ....... | 357/60 |
| 5,040,044 A * | 8/1991 | Noguchi et al. | ............ | 257/103 |
| 5,373,174 A | 12/1994 | Yamamoto | .................. | 257/88 |
| 5,491,350 A | 2/1996 | Unno et al. | ................... | 257/99 |
| 5,652,434 A | 7/1997 | Nakamura et al. | ............ | 257/13 |
| 5,779,924 A | 7/1998 | Krames et al. | ............... | 216/24 |
| 5,814,839 A | 9/1998 | Hosoba | ...................... | 257/96 |
| 5,912,477 A | 6/1999 | Negley | ........................ | 257/95 |
| 5,929,467 A | 7/1999 | Kawai et al. | ................ | 257/192 |
| 5,962,875 A | 10/1999 | Motoki et al. | ............... | 257/103 |
| 6,015,979 A | 1/2000 | Sugiura et al. | ............... | 257/86 |
| 6,046,465 A | 4/2000 | Wang et al. | .................. | 257/98 |
| 6,051,849 A | 4/2000 | Davis et al. | ................. | 257/103 |
| 6,091,085 A | 7/2000 | Lester | .......................... | 257/98 |
| 6,111,277 A | 8/2000 | Ikeda | .......................... | 257/99 |
| 6,133,589 A | 10/2000 | Krames et al. | ............. | 257/103 |
| 6,153,010 A | 11/2000 | Kiyoku et al. | ................ | 117/95 |
| 6,229,151 B1 | 5/2001 | Takeuchi et al. | .............. | 257/14 |
| 6,291,839 B1 | 9/2001 | Lester | | |
| 6,316,785 B1 * | 11/2001 | Nunoue et al. | ............... | 257/14 |
| 6,410,942 B1 | 6/2002 | Thibeault et al. | | |

FOREIGN PATENT DOCUMENTS

EP 1 276 158 A2 6/2002
WO WO 01/41225 A2 6/2001

OTHER PUBLICATIONS

X. Li et al., "Spatially Resolved Bank-Edge Emission From Partially Coaleseed GaN Pyramids Prepared By Epitaxial Lateral Overgrowth," App. Phys. Lett., vol. 76, No. 21, pp. 3031-3033, (May 22, 2000).

(Continued)

*Primary Examiner*—Sara Crane
(74) *Attorney, Agent, or Firm*—Patent Law Group LLP; Rachel V. Leiterman

(57) ABSTRACT

A light emitting device includes a substrate, a textured layer overlying the substrate, at least one III-nitride layer overlying the textured layer, and a substantially planar light emitting region. Devices incorporating scattering layers may be formed by several different methods. In a first method, an epitaxial layer is deposited then etched to form the textured layer. In a second method, a photomask is deposited and patterned to create openings in the photomask. The textured layer is then preferentially deposited in the openings formed in the photomask. In a third method, the textured layer is deposited under conditions that favor three-dimensional growth, then optionally annealed.

22 Claims, 7 Drawing Sheets

OTHER PUBLICATIONS

Kitamura et al., "Fabrication of GaN Hexagonal Pyramids on Dot-Patterned GaN/Sapphire Substrates via Selective Metalorganic Vapor Phase Epitaxy," Jpn. J. Appl. Phys. vol. 34, No. 9B, pp. L1184-1186, (1995).

Kapolnek et al., "Selective area epitaxy of GaN for electron field emission devices," J. Crystal Growth 170, pp. 340-343 (1997).

Patent Abstracts of Japan. Publication No. 10215029, publication date: Nov. 8, 1998, 2 pages.

Ju. Han, T-B. et al., "The Effect of $H_2$ on Morphology Evolution GaN Metalorganic Chemical Vapor Deposition," Appl. Phys. Lett. 71 (21), Nov. 24, 1997, pp. 3114-3116.

* cited by examiner

LIGHT EMITTING DEVICE WITH ENHANCED OPTICAL SCATTERING

BACKGROUND

Semiconductor light-emitting devices such as light emitting diodes are among the most efficient light sources currently available. Materials systems currently of interest in the manufacture of high-brightness LEDs capable of operation across the visible spectrum include Group III–V semiconductors, particularly binary, ternary, and quaternary alloys of gallium, aluminum, indium, and nitrogen, also referred to as III-nitride materials. Light emitting devices based on the III-nitride materials system provide for high brightness, solid-state light sources in the UV-to-yellow spectral regions. Typically, III-nitride devices are epitaxially grown on sapphire, silicon carbide, or III-nitride substrates by metal-organic chemical vapor deposition (MOCVD), molecular beam epitaxy (MBE), or other epitaxial techniques. Some of these substrates are insulating or poorly conducting. Devices fabricated from semiconductor crystals grown on such substrates must have both the positive and the negative polarity electrical contacts to the epitaxially-grown semiconductor on the same side of the device. In contrast, semiconductor devices grown on conducting substrates can be fabricated such that one electrical contact is formed on the epitaxially grown material and the other electrical contact is formed on the substrate. However, devices fabricated on conducting substrates may also be designed to have both contacts on the same side of the device on which the epitaxial material is grown in a flip-chip geometry so as to improve light extraction from LED chip, to improve the current-carrying capacity of the chip, or to improve the heat-sinking of the LED die. Two types of light emitting devices have the contacts formed on the same side of the device. In the first, called a flip chip, light is extracted through the substrate. In the second, light is typically extracted through transparent or semi-transparent contacts formed on the epitaxial layers.

The use of a substrate with a low index of refraction, such as sapphire, may lead to poor optical extraction efficiency in a flip chip device due to the large different in index of refraction at the interface between the semiconductor layers and the substrate. FIG. 1 illustrates the interface between a GaN layer 11 and a sapphire substrate 12. When light ray 10a is incident on the interface, a portion 10c is transmitted into the sapphire and a portion 10b is reflected back into GaN layer 11. In the regime in which classical optics apply, the angle of transmission is governed by Snell's law: $n_{sapphire} \sin T = n_{GaN} \sin I$, where $n_{sapphire}$ is the refractive index of sapphire (1.8), $n_{GaN}$ is the refractive index of GaN (2.4), T is the angle of transmission, and I is the angle of incidence. When light is incident on the interface at an angle larger than a critical incidence angle, all of the incident light is reflected back into the GaN. For light propagating through GaN and incident on sapphire, the critical incidence angle is about 50°. Reflected light may make many passes through the device before it is extracted, if it is extracted at all. These many passes result in significant attenuation of the light due to optical losses at contacts, free carrier absorption, and interband absorption within any of the III-nitride device layers.

One way to reduce the amount of light reflected back into the GaN layer in a flip chip device is to include a scattering structure at the interface between the GaN and the substrate. The scattering structure interrupts the smooth interface such that a smaller amount of light strikes the interface at an angle larger than the critical angle, resulting in a larger amount of light entering the substrate. In U.S. Pat. No. 6,091,085, titled "GaN LEDs With Improved Output Coupling Efficiency," a sapphire substrate is roughed prior to the formation of GaN device layers. The roughened surface is a scattering structure that increases the amount of light transmitted into the substrate. The substrate may be roughed mechanically, such as by scratching the surface with grinding grit, or by photolithographically patterning the substrate. Using a roughened substrate surface as a scattering structure has several disadvantages. Mechanical roughening creates a non-reproducible substrate surface. Since the substrate surface can impact the quality of the III-nitride device layers grown over the substrate, the use of non-reproducible substrates can cause unacceptable variations in brightness and efficiency between devices. In addition, if the substrate surface is too rough, III-nitride device layers of sufficient quality for light emitting devices may not grow on the substrate. Photolithographic patterning and etching of sapphire is costly, and can also result in a substrate that is inappropriate for growth of III-nitride device layers.

SUMMARY

In accordance with embodiments of the invention, a light emitting device includes a substrate, a textured layer overlying the substrate, at least one III-nitride layer overlying the textured layer, and a substantially planar light emitting region. In some embodiments, the textured layer is AlN or AlGaN. The textured layer may comprise one or more islands having a height and lateral dimension between about 0.06 micron and about 10 microns.

Devices incorporating textured layers may be formed by several different methods. In a first method, an epitaxial layer is deposited then etched to form the textured layer. In a second method, a mask is deposited and patterned to create openings in the mask. The textured layer is then preferentially deposited in the openings formed in the mask. In a third method, the textured layer is deposited under conditions that favor three-dimensional growth, then optionally annealed.

DETAILED DESCRIPTION

In accordance with embodiments of the invention, at least one textured layer is included in a light emitting device to scatter light out of the device. The embodiments described below are III-nitride devices. Embodiments of the invention may be applicable to light emitting devices fabricated from III-phosphide, III-arsenide, II–VI, or any other suitable materials system. In addition, the embodiments described below are directed to GaN-based III-nitride devices which generally emit light in the visible spectrum. Embodiments of the invention are also applicable to AlGaN-based III-nitride devices that emit light in the UV spectrum.

Figure 1:
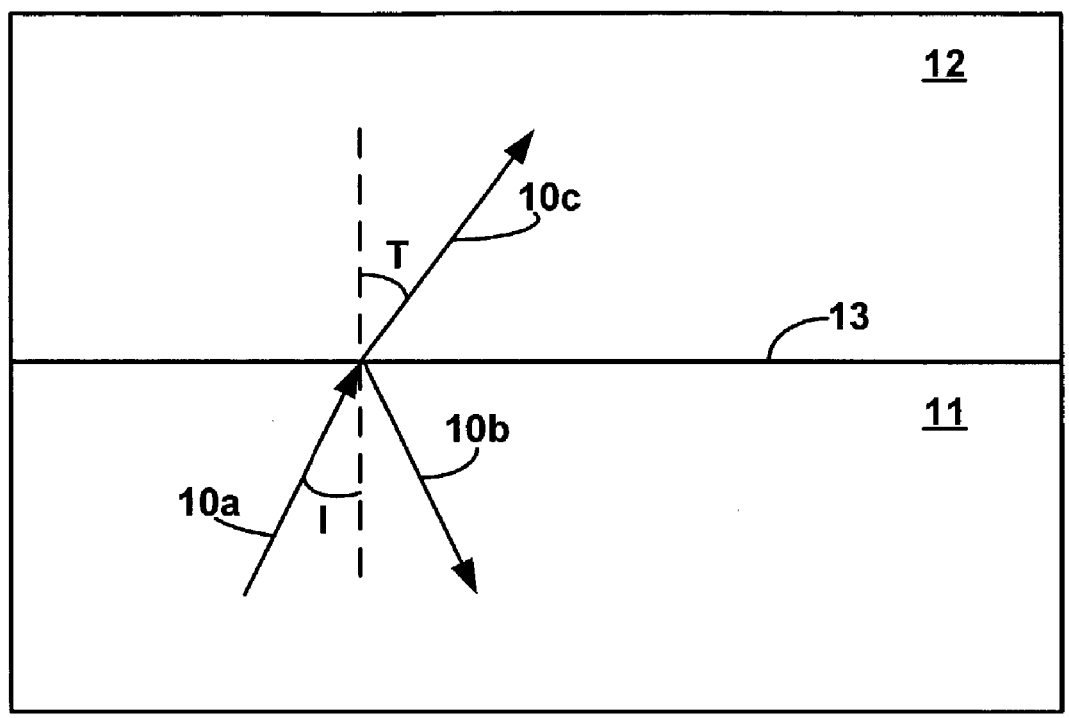
FIG. 1 illustrates a light beam incident on an interface between GaN and sapphire.
Figure 2A:
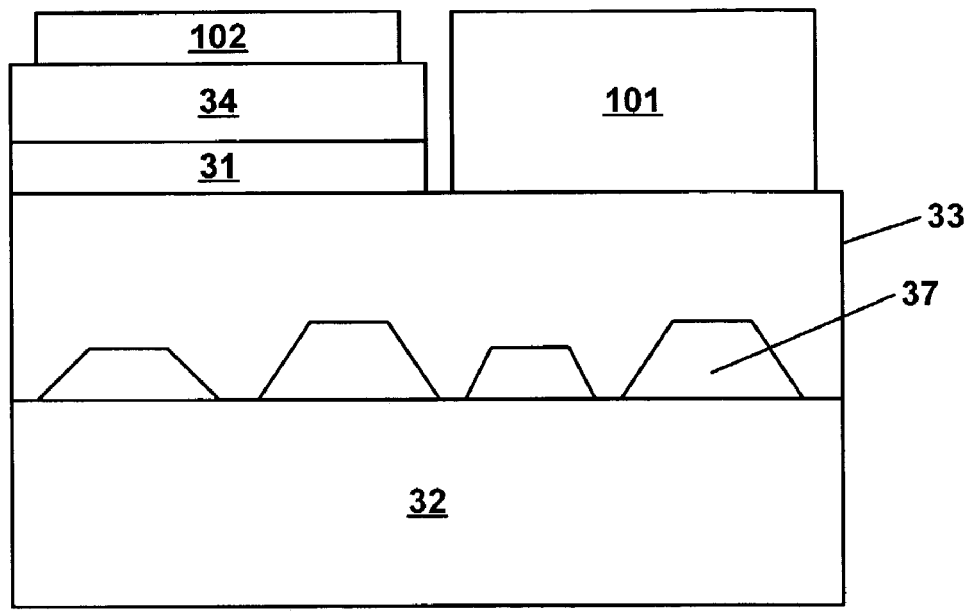
FIGS. 2A–2D illustrate light emitting devices incorporating embodiments of the present invention.

FIG. 2A illustrates a light emitting device incorporating a first embodiment of a textured layer according to the present invention. In the embodiment illustrated in FIG. 2A, textured layer 37 overlies a substrate 32 of a low index of refraction material such as sapphire. N-type region 33 overlies textured layer 37. N-type region may include one or more layers of the same or different composition, thickness, and dopant concentration, for example, an undoped GaN layer, an n-type layer optimized for contact, and an n-type layer optimized for current injection into the active region. N-type region 33 may be doped with, for example, Si. An active region 31 is formed over n-type region 33. Active region 31 may include, for example, one or more quantum well layers (light emitting layers) separated by barrier layers. P-type region 34 is formed over the active region. P-type region 34 may include one or more layers of the same or different composition, thickness, and dopant concentration. P-type region 34 may be doped with, for example, Mg. A portion of active region 31 and p-type region 34 is removed to expose a portion of n-type region 33. An n-contact 101 is formed on the exposed portion of n-type region 33 and a p-contact 102 is formed on the remaining portion of p-type region 34. In a flip chip device, one or both of contacts 101 and 102 may be reflective. In a device where light is extracted through the contacts, all or portions of contacts 101 and 102 may be transparent.

The composition and structure of textured layer 37 are selected to scatter light out of the device. Textured layer 37 has a three dimensional structure in order to promote optical scattering. In contrast, other layers in the device, such as active region 31 in FIG. 2A, are generally planar, meaning they have a substantially smooth surface with no significant three dimensional features. To provide scattering, the three dimensional features in textured layer 37 optimally have a dimension greater than $\lambda_n/4$, where $\lambda_n$ is the wavelength of light in the material that forms textured layer 37. In the embodiment illustrated in FIG. 2A, the three dimensional features are islands. The height and width of the islands in textured layer 37 may be between about 0.06 micron and about 10 microns, and are usually between 0.06 micron and 1 micron. The height and width of the islands need not be equal, and all of the islands in textured layer 37 need not be of the same size. In addition, though islands with flat tops are illustrated in FIG. 2A, the islands may have pointed tops, or be of any other shape that causes scattering.

The composition of textured layer 37 is selected such that there is a change in index of refraction between the interface of textured layer 37 and the planarizing layer overlying textured layer 37 (n-type region 33 in FIG. 2A). In general, textured layer 37 has a lower index of refraction than the layer overlying textured layer 37, though textured layer 37 may still provide scattering if it has a higher index of refraction than the overlying layer.

Figure 2B:
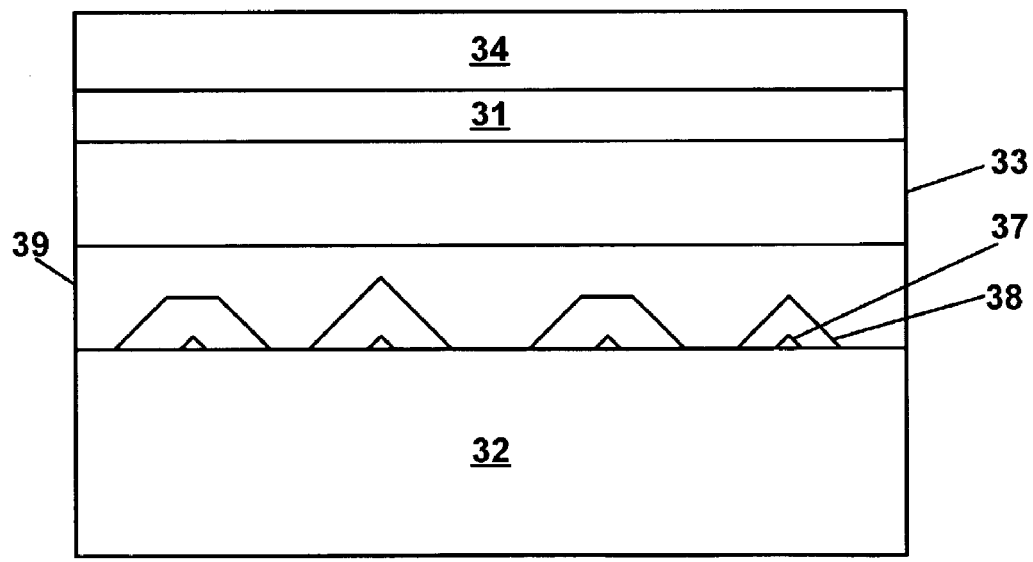
Figure 2C:
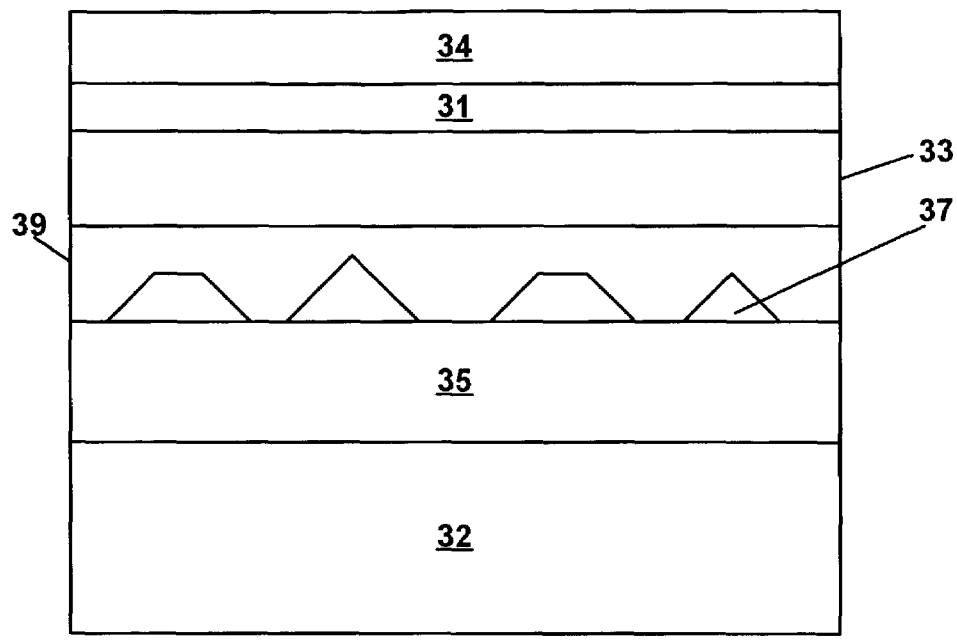
Figure 2D:
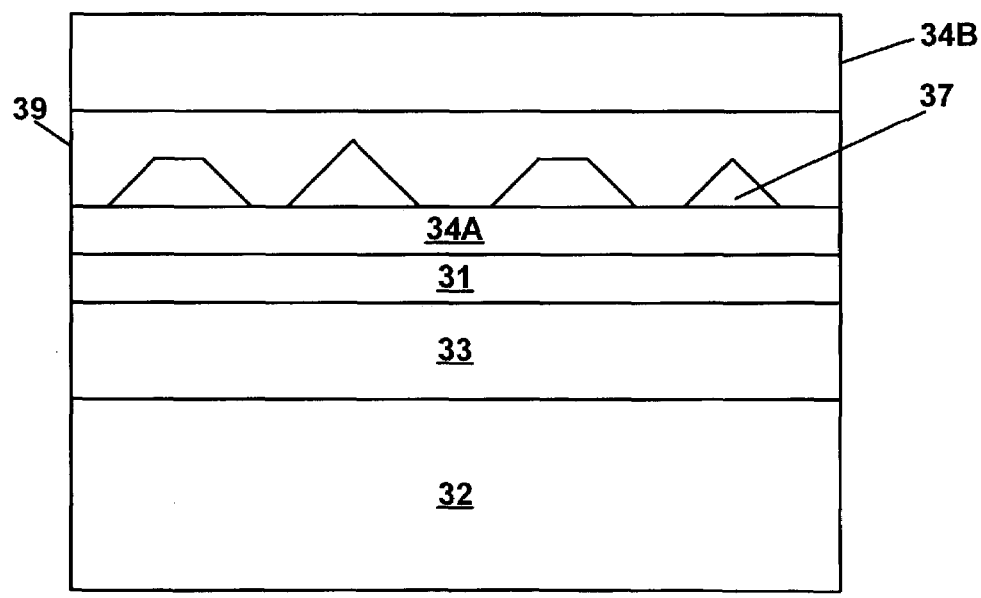

Textured layer 37 may be located on the n-type side of active region 31, as illustrated in FIGS. 2A–2C, or on the p-type side of active region 31, as illustrated in FIG. 2D. Generally, active region 31 is planar.

In the embodiment illustrated in FIG. 2A, textured layer 37 is an optically transparent material with an index of refraction close to the index of refraction of the substrate. For a sapphire substrate, scattering layer 37 may be an AlN or AlGaN layer. Generally, as the Al composition decreases, the index of refraction increases. The index of refraction of AlGaN varies from about 2.0 in a layer containing little or no gallium to about 2.4 in a layer containing little or no aluminum. In some embodiments, textured layer 37 is an AlGaN layer with an aluminum composition between about 50% and 100%. Textured layer 37 may be doped with a p-type dopant such as Mg, or with an n-type dopant such as Si. The presence of dopants in textured layer 37 can stabilize the three-dimensional structure of and provide strain relief to the layers fabricated over textured layer 37. The next layer grown over textured layer 37 provides a planar surface on which to form the remaining layers in the structure. In the embodiment illustrated in FIG. 2A, the planarizing layer is part of n-type region 33, meaning that the planarizing layer serves a purpose in the device in addition to planarizing the growth surface after the formation of textured layer 37. In other embodiments, the planarizing layer is an additional layer in the device, separate from the layers in n-type region 33, active region 31, and p-type region 34 that would be included if the device did not include textured layer 37. In such embodiments, the planarizing layer may be undoped, or lightly doped with a p- or n-type dopant. The planarizing layer generally has a different index of refraction than textured layer 37 and may be GaN, AlGaN, AlInGaN, or InGaN.

FIG. 2B illustrates a structure with an additional textured layer 38 formed substantially conformally over textured layer 37. Textured layer 37 may be a plurality of GaN seed crystals that form nucleation sites for the growth of an AlN or AlGaN textured layer 38 overlying textured layer 37. Textured layer 37 may be grown directly on substrate 32, or on an underlying layer (not shown) formed on substrate 32. Textured layer 38 is grown under conditions that favor three-dimensional growth, thus textured layer 38 substantially preserves the shape of underlying textured layer 37. In the embodiment illustrated in FIG. 2B, planarizing layer 39 is an additional layer separate from n-type region 33. The planarizing layer can also be a part of n-type region 33. Textured layer 38 and planarizing layer 39 have different indices of refraction so as to cause scattering at the interface of layers 38 and 39.

FIG. 2C illustrates a structure where textured layer 37 is separated from substrate 32 by an additional layer 35. Additional layer 35 may be, for example, a nucleation layer.

FIG. 2D illustrates a structure where textured layer 37 is located on the p-type side of active region 31. Textured layer 37 may be formed directly on active region 31 or may be separated from active region 31 by a portion 34A of p-type region 34 or an additional layer separate from p-type region 34. In one example of the structure illustrated in FIG. 2D, layer 34A may be a p-doped AlGaN layer, textured layer 37 may be an AlGaN layer, and planarizing layer 39 and p-type layer 24B may be p-type GaN layers.

Figure 3:
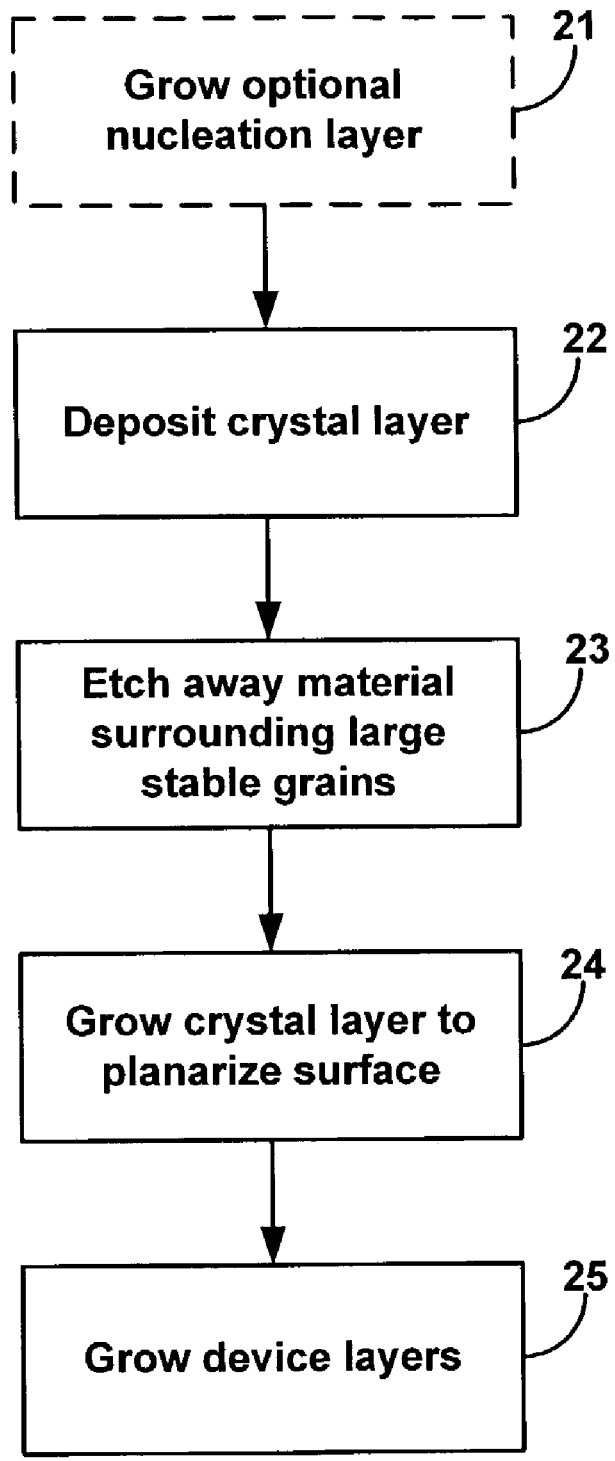
FIG. 3 illustrates a portion of a method of fabricating a light emitting device incorporating a textured layer.

The devices illustrated in FIGS. 2A–2D may be fabricated by several techniques. A first method of fabricating a device incorporating a textured layer is illustrated in FIG. 3. In stage 21, an optional nucleation or other III-nitride layer is grown over the substrate. Suitable nucleation layers include, for example, GaN, AlGaN, and AlN layers. In stage 22, a crystal layer which will later form the textured layer (generally AlN or AlGaN) is deposited. The layer of AlN or AlGaN is usually deposited by an epitaxial technique at high temperature. For example, the AlN or AlGaN layer may deposited by MOCVD at a temperature between 900° and 1200° C.

Portions of the AlN or AlGaN layer are then etched away in stage 23. The etchant gas is selected to preferentially etch away the smaller, less stable crystals in the crystal layer.

Suitable etchant gases include $H_2$, $N_2$, and $NH_3$, HCl, and mixtures thereof. The larger, more stable crystals remain, forming discontinuous islands of material 37 which will eventually act as light scattering elements in the final, fully-processed structure.

In stage 24, a III-nitride layer with a different index of refraction is grown over the textured layer formed in stage 23 to planarize the growth surface of the device. The planarizing layer is grown under conditions which promote lateral growth, in order to fill in the gaps between the islands in the scattering layer to create a planar surface on which to form other device layers. For example, the planarizing layer may be formed at high temperature (e.g. over 10001° C.) with low precursor gas flow rates to promote slow growth. Other device layers such as n-type layers, light emitting layers and p-type layers are then formed over the planar surface of the planarizing layer in stage 25.

Figure 4A:
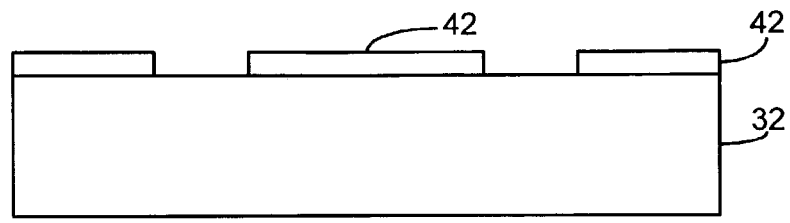
FIGS. 4A, 4B & 4C illustrate a light emitting device incorporating a textured layer at various stages in fabrication.
Figure 4B:
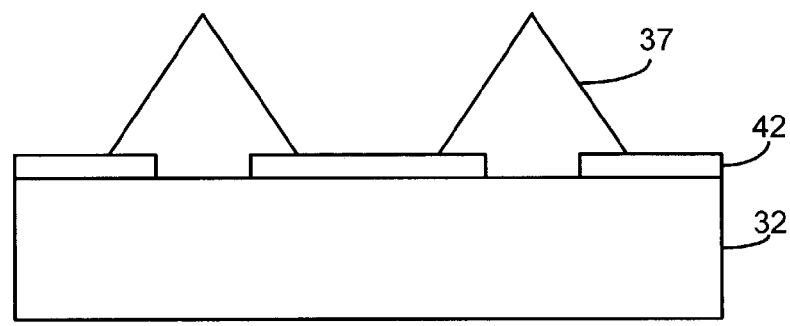
Figure 4C:
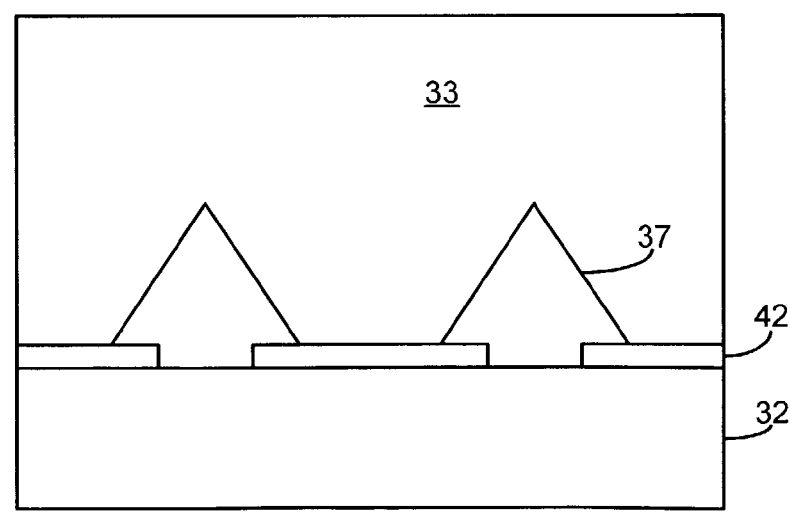

A second method of fabricating a device incorporating a textured layer is illustrated in FIGS. 4A, 4B & 4C. This method involves growing the textured layer through a mask. FIGS. 4A–4C illustrate cross-sections of the device at various stages in the growth process. In FIG. 4A, a patterned mask layer 42 is placed over a sapphire substrate 32. Mask layer 42 may be, for example, silicon dioxide deposited by sputtering, evaporation, or chemical vapor deposition. Mask layer 42 is patterned to expose portions of substrate 32. In some embodiments, one or more buffer or nucleation layers (not shown) may be located between mask layer 42 and substrate 32.

In FIG. 4B, a textured layer 37 is grown over patterned layer 42. Mask layer 42 is selected such that the atoms that form textured layer 37 will not preferentially deposit on mask layer 42. As a result, the material forming textured 37 deposits initially only in the openings formed in mask 42, then continues growing up and laterally over the mask, resulting in islands of material instead of a planar layer. In FIG. 4C, a planar layer is formed over textured layer 37. The remaining device layers are then formed over the planar layer.

Figure 5:
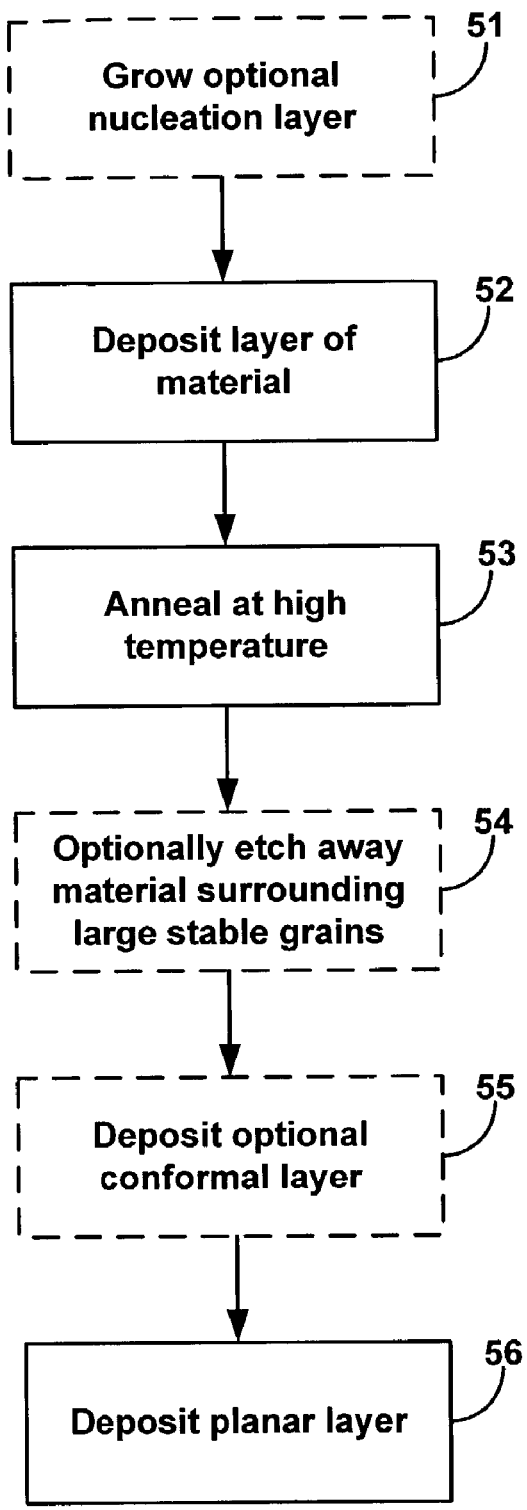
FIG. 5 illustrates a portion of a method of fabricating a light emitting device incorporating a textured layer.

A third method of forming a device incorporating a scattering layer is illustrated in FIG. 5. An optional nucleation layer may be grown over the substrate in stage 51. A layer of material which will form the textured layer (generally AlN or AlGaN) is deposited in stage 52 by, for example, sputtering, reactive growth, or chemical vapor deposition. In some embodiments, the material grown in stage 52 is grown under conditions that favor three dimensional growth. The layer of AlN or AlGaN material is then annealed in stage 53, such that the material becomes crystalline. In stage 54, portions of the annealed layer that surround large stable grains are optionally etched away with $H_2$, $N_2$, $NH_3$, HCl, and mixtures thereof to form a textured layer. In embodiments where the growth in stage 52 favors three dimensional growth, annealing in stage 53 may be sufficient to form the textured layer 37 of FIGS. 2A–2D, such that etching is not required. In some embodiments, such as the embodiment illustrated in FIG. 2B, an additional textured layer, which is substantially conformal to the layer formed in stages 52, 53, and 54, is deposited in stage 55. Finally, a planarizing layer is deposited in stage 56.

In some embodiments, textured layer 37 is grown under conditions that cause three-dimensional growth of high crystal quality layers. In such embodiments, neither etching as described in FIG. 3 nor annealing as described in FIG. 5 are necessary to form a structure suitable for scattering.

Three dimensional and lateral growth techniques are discussed in more detail in J. Han et al., "The effect of $H_2$ on morphology evolution during GaN metalorganic chemical vapor deposition," Appl. Phys. Lett., 71 (21), pp. 3114–16 (24 Nov. 1997), which is incorporated herein by reference.

Figure 6:
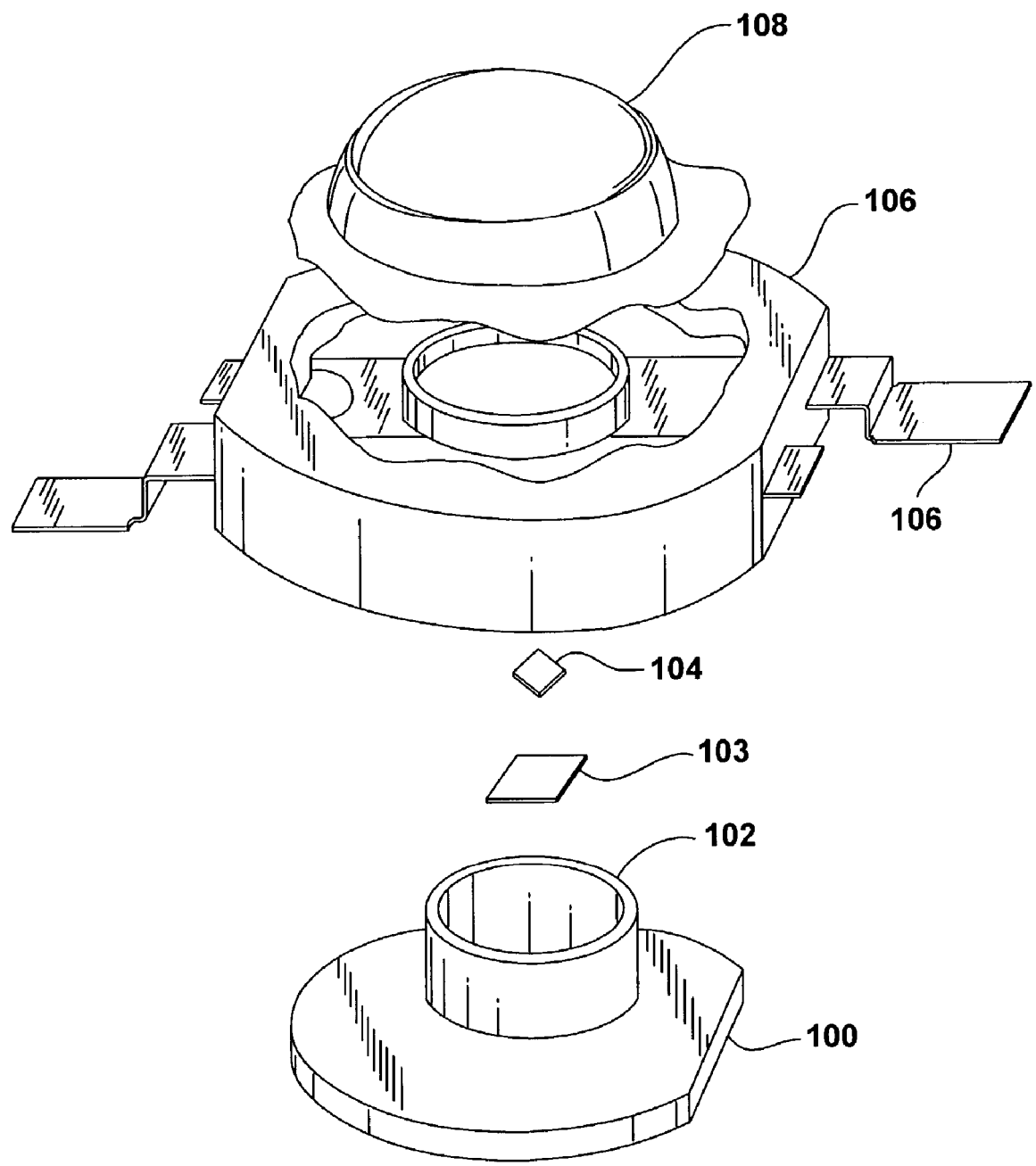
FIG. 6 illustrates an exploded view of a packaged light emitting device.

FIG. 6 is an exploded view of a packaged light emitting device. A heat-sinking slug 100 is placed into an insert-molded leadframe 106. The insert-molded leadframe 106 is, for example, a filled plastic material molded around a metal frame that provides an electrical path. Slug 100 may include an optional reflector cup 102. Alternatively, slug 100 may provide a pedestal without a reflector cup. The light emitting device die 104, which may any of the devices described above, is mounted directly or indirectly via a thermally conducting submount 103 to slug 100. A cover, which may be an optical lens 108 may be added.

In accordance with the invention, a device incorporating a textured layer may offer several advantages. In devices where the textured layer is adjacent to or near the substrate, the textured layer may break up the planar interface between a low index substrate and a high index device layer. The three-dimensional features in the textured layer result in more light striking the interface at an angle which permits the light to be transmitted into the substrate.

Various modifications to the present invention will become apparent to those skilled in the art from the foregoing description and accompanying drawings. Accordingly, the present invention is to be limited solely by the scope of the following claims.

We claim:

1. A light emitting device comprising:
   semiconductor layer textured with nonperiodic features;
   at least one III-nitride layer overlying and in direct contact with the textured layer; and
   a substantially planar light emitting region;
   wherein an index of refraction of the textured layer is less than an index of refraction of the at least one III-nitride layer.

2. The device of claim 1 further comprising a substrate, wherein the textured layer is located between the substrate and the light emitting region.

3. The device of claim 1 wherein the textured layer overlies the light emitting region.

4. The device of claim 1 further comprising a substrate, wherein the substrate has an index of refraction less than about 2.4.

5. The device of claim 1 further comprising a substrate, wherein the substrate is sapphire.

6. The device of claim 1 wherein the textured layer is optically transparent.

7. The device of claim 1 wherein the textured layer is AlGaN.

8. The device of claim 1 wherein the textured layer is AlGaN having an Al composition between about 50% and about 100%.

9. The device of claim 1 wherein the textured layer is MlN.

10. The device of claim 1 further comprising a substrate, wherein the textured layer is adjacent to the substrate.

11. The device of claim 1 further comprising a conformal layer overlying the textured layer, wherein the conformal layer is substantially conformal with the underlying textured layer.

12. The device of claim 1 further comprising a substrate and a III-nitride layer disposed between the substrate and the textured layer.

13. The device of claim 1 wherein the textured layer comprises three-dimensional features having a dimension greater than or equal to about $\lambda_n/4$, where $\lambda_n$ is a wavelength of light emitted by the light emitting region in the textured layer.

14. The device of claim 1 wherein the at least one III-nitride layer overlying the textured layer comprises a non-planar surface adjacent to the textured layer and a planar surface opposite the textured layer.

15. The device of claim 1 further comprising:
a substrate;
an n-type region;
a p-type region, wherein the light emitting region is disposed between the n-type region and the p-type region;
an n-contact formed on the n-type region;
a p-contact formed on the p-type region;
leads electrically connected to the n-contact and the p-contact; and
a cover disposed on a side of the substrate opposite the light emitting region.

16. The device of claim 1 wherein the textured semiconductor layer is formed by:
growing a crystalline semiconductor layer; and
etching the crystalline semiconductor layer, wherein an etchant gas and etching conditions are selected to preferentially etch away small, less stable crystals in the crystalline layer and leave large, more stable crystals.

17. The device of claim 1 wherein the textured semiconductor layer is formed by:
depositing a layer of material; and
annealing the layer of material such that the layer of material becomes crystalline.

18. The device of claim 1 wherein the textured semiconductor layer has a cross section comprising a plurality of hills separated by a plurality of valleys.

19. The device of claim 18 wherein at least one of the hills has a height between about 0.06 micron and about 10 microns.

20. The device of claim 18 wherein at least one of the hills has a height between about 0.06 micron and about 1 micron.

21. The device of claim 18 wherein at least one of the hills has a width between about 0.06 micron and about 10 microns.

22. The device of claim 18 wherein at least one of the hills has a width between about 0.06 micron and about 1 micron.

* * * * *